(12) United States Patent
Seo et al.

(10) Patent No.: US 11,502,527 B2
(45) Date of Patent: Nov. 15, 2022

(54) BATTERY CELL SCREENING DEVICE AND BATTERY CELL SCREENING METHOD

(71) Applicant: SK Innovation Co., Ltd., Seoul (KR)

(72) Inventors: Jeong Min Seo, Daejeon (KR); Byung Eun Lee, Daejeon (KR); Kyu Min Hwang, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 18 days.

(21) Appl. No.: 17/151,733

(22) Filed: Jan. 19, 2021

(65) Prior Publication Data

US 2021/0226462 A1 Jul. 22, 2021

(30) Foreign Application Priority Data

Jan. 20, 2020 (KR) ........................ 10-2020-0007162

(51) Int. Cl.
*G01R 31/00* (2006.01)
*H02J 7/00* (2006.01)
*G01R 31/396* (2019.01)
*G01R 31/389* (2019.01)
*G01R 31/388* (2019.01)
*G01R 31/392* (2019.01)

(52) U.S. Cl.
CPC .......... *H02J 7/0047* (2013.01); *G01R 31/388* (2019.01); *G01R 31/389* (2019.01); *G01R 31/392* (2019.01); *G01R 31/396* (2019.01); *H02J 7/0013* (2013.01); *H02J 7/005* (2020.01); *H02J 7/0048* (2020.01)

(58) Field of Classification Search
USPC ......................................... 324/426, 430–435
See application file for complete search history.

(56) References Cited

U.S. PATENT DOCUMENTS

2015/0258897 A1 9/2015 Okada et al.
2019/0312318 A1* 10/2019 Myers ................. H01M 10/482

FOREIGN PATENT DOCUMENTS

| JP | 5040731 B2 | 10/2012 |
| JP | 5932596 B2 | 6/2016 |
| JP | 6184815 B2 | 8/2017 |
| KR | 101073277 B1 | 10/2011 |
| KR | 1020130110355 A | 10/2013 |

* cited by examiner

*Primary Examiner* — Vincent Q Nguyen
(74) *Attorney, Agent, or Firm* — The Webb Law Firm (57) ABSTRACT

Provided are a cell screening device for selecting battery cells of a high-risk group, and a cell screening method using the same. According to the present invention, the battery cells may be ordered in the order of high probability of being out of an upper limit value or a lower limit value of an operating voltage among a plurality of battery cells using state information calculated for each battery cell, thereby making it possible to select the battery cells of the high-risk group.

8 Claims, 6 Drawing Sheets

PRIOR ART

FIG. 1A

PRIOR ART

BATTERY CELL SCREENING DEVICE AND BATTERY CELL SCREENING METHOD

CROSS-REFERENCE TO RELATED APPLICATION

This application claims priority to Korean Patent Application No. 10-2020-0007162 filed Jan. 20, 2020, the disclosure of which is hereby incorporated by reference in its entirety.

BACKGROUND OF THE INVENTION

Field of the Invention

The following disclosure relates to a cell screening device for selecting battery cells of a high-risk group that has a risk of being out of an operating voltage range among a plurality of battery cells constituting a battery pack, and a cell screening method using the same.

Description of Related Art

As a general method of estimating a state (SoC: State Of Charge, SoH: State Of Health, etc.) of a battery used in an electric vehicle, there is a method of determining the state of the battery by selecting values representing a plurality of battery cells (representative voltage, representative internal resistance, representative capacity, etc.).

A battery management system (BMS) adjusts a current flowing through a battery pack so that the battery is charged and discharged between an upper limit voltage during charging and a lower limit voltage during discharging using the determined battery state. This is because if the voltage of the battery cell is repeatedly out of a boundary of the upper and lower limit voltages, that is, an operating voltage range during charging and discharging, the battery cell deteriorates and negatively affects a life of the battery. However, in an actual battery pack, there is deviation in the state between the battery cells from the beginning of production, and such variation may further increase as the electric vehicle is driven. When the deviation between the battery cells increases in this way, an error also increases in an estimation of the battery state using the values representing the plurality of battery cells.

Figure 1A:
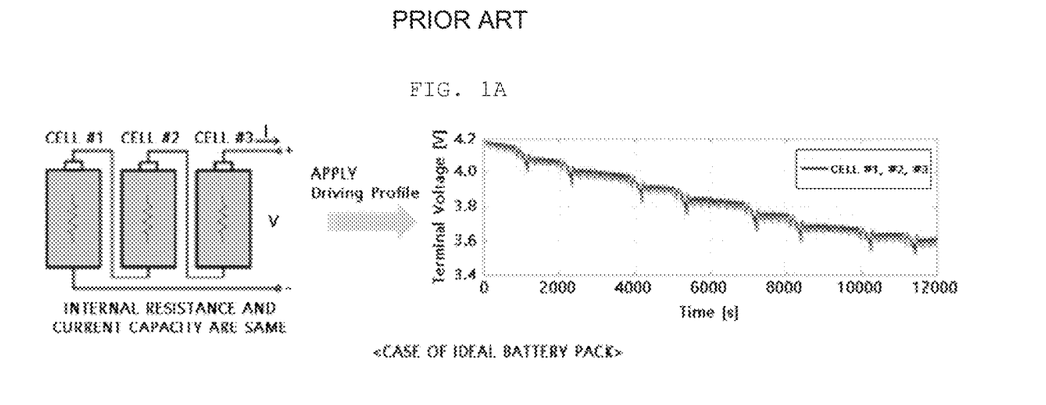
FIG. 1A is a diagram illustrating a change in a terminal voltage over time in battery cells included in an ideal battery pack.

FIG. 1A illustrates a change in a terminal voltage over time in the case of an ideal battery pack. Referring to FIG. 1A, since each battery cell included in the ideal battery pack has the same internal resistance and current capacity, a constant rate of decrease of the terminal voltage over time, and the same terminal voltage, there is no problem in determining the state of the battery through the representative value.

Figure 1B:
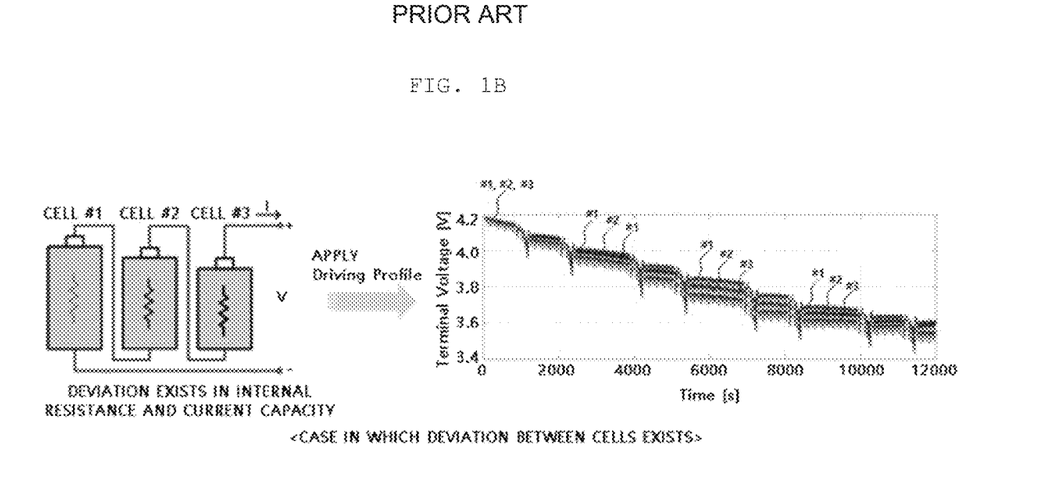
FIG. 1B is a diagram illustrating a change in a terminal voltage over time in battery cells included in an actual battery pack.

In contrast, FIG. 1B illustrates a change in a terminal voltage over time in the case of an actual battery pack. Referring to FIG. 1B, since the internal resistance, current capacity, and the like of each battery cell included in the actual battery pack are different from each other and the rates of decrease of the terminal voltage over time are different from each other, the deviation in a value of the terminal value of each battery cell becomes severe as time passes. Therefore, in the case of determining the state of the battery by representing any one cell or determining the state of the battery through an average value of the battery cells, a battery that first reaches an upper limit voltage of charging during charging or a battery that first reaches a lower limit voltage of discharging during discharging occurs. In this way, the battery that is out of the operating voltage range continuously deteriorates, and eventually an efficiency of the entire battery pack, as well as stability of the battery pack may decrease, resulting in a risk that the electric vehicle stops while being driven.

Therefore, in order to prevent such a risk, it is necessary to grasp the state of each of the plurality of battery cells constituting the battery pack, and it is necessary to select and specially manage battery cells of a high-risk group that has a possibility of deteriorating by first reaching the upper or lower limit value of the operating voltage among the battery cells.

RELATED ART DOCUMENT

Patent Document (Patent Document 1) KR 2013-0110355 A

SUMMARY OF THE INVENTION

An embodiment of the present invention is directed to providing a device and method capable of calculating an actual usable capacity of a battery pack.

Further, an embodiment of the present invention is directed to providing a device and method for selecting battery cells of a high-risk group, among a plurality of battery cells, which has a possibility of deteriorating by first reaching an upper limit value or a lower limit value of an operating voltage.

In one general aspect, a battery cell screening device comprising: a state information calculation unit configured to calculate state information of each of a plurality of battery cells; and a cell selection unit configured to select at least one battery cell of a high-risk group using the state information, wherein the at least one battery cell of the high-risk group includes a battery cell having a terminal voltage that is out of an operating voltage during a charge or a discharge, and the cell selection unit selects the at least one battery cell of the high-risk group by ordering the state information.

The state information calculation unit may receive at least one of a temperature of a battery pack or each of the battery cells, a voltage of each of the battery cells, and a current of the battery pack from the battery pack including the plurality of battery cells, and calculate at least one of a state of charge (SoC), a state of health (SoH), and an internal resistance of each of the battery cells as state information, and the cell selection unit may order each battery cell for each state information according to an order in which the terminal voltage during charging is likely to exceed an upper limit value of the operating voltage.

The cell selection unit may select, among the ordered battery cells, battery cells of an essential high-risk group having the highest probability that the terminal voltage during charging exceeds an upper limit value of the operating voltage, for each state information, use the battery cells of the essential high-risk group to select battery cells of an additional high-risk group having a probability that the terminal voltage during charging exceeds the upper limit value for each state information, and select battery cells corresponding to a union of the battery cells of the essential high-risk group and the battery cells of the additional high-risk group as battery cells of a final high-risk group.

The state information calculation unit may receive at least one of a temperature of the battery pack or each of the battery cells, a voltage of each of the battery cells, and a current of the battery pack from the battery pack, and calculate at least one of a state of charge (SoC), a state of health (SoH), and an internal resistance of each of the battery cells as state information, and the cell selection unit may order each battery cell for each state information according to an order in which the terminal voltage during discharging is likely to be less than a lower limit value of the operating voltage.

The cell selection unit may select, among the ordered battery cells, battery cells of an essential high-risk group having the highest probability that the terminal voltage during discharging is less than a lower limit value of the operating voltage, for each state information, select battery cells of an additional high-risk group having a probability that the terminal voltage during discharging is less than the lower limit value for each state information by using the battery cells of the essential high-risk group, and select battery cells corresponding to a union of the battery cells of the essential high-risk group and the battery cells of the additional high-risk group as battery cells of a final high-risk group.

In another general aspect, a battery cell screening method comprising: calculating state information of each of a plurality of battery cells; and selecting at least one battery cell of a high-risk group using the state information, wherein the at least one battery cell of the high-risk group includes a battery cell having a terminal voltage that is out of an operating voltage during a charge or a discharge, and in the selecting of the at least one battery cell of the high-risk group, the at least one battery cell of the high-risk group is selected by ordering the state information.

In the calculating of the state information of each of the battery cells, at least one of a temperature of a battery pack or each of the battery cells, a voltage of each of the battery cells, and a current of the battery pack may be received from the battery pack including the plurality of battery cells, and at least one of a state of charge (SoC), a state of health (SoH), and an internal resistance of each of the battery cells may be calculated as the state information.

The selecting of the battery cells of the high-risk group may include: ordering each battery cell for each state information according to an order in which the terminal voltage during charging is likely to exceed an upper limit value of the operating voltage, selecting, among the ordered battery cells, battery cells of an essential high-risk group having the highest probability that the terminal voltage during charging exceeds the upper limit value, for each state information, selecting battery cells of an additional high-risk group having a probability that the terminal voltage during charging exceeds the upper limit value for each state information by using the battery cells of the essential high-risk group, and selecting battery cells corresponding to a union of the battery cells of the essential high-risk group and the battery cells of the additional high-risk group as battery cells of a final high-risk group.

In the ordering of each battery cell for each state information according to the order in which the terminal voltage during charging is likely to exceed the upper limit value of the operating voltage, the terminal voltage according to the SoC of each of the battery cells may be calculated to order the battery cells in an order of the higher terminal voltage, order the battery cells in an order of the lower SoH of each of the battery cells, and order the battery cells in an order of the higher internal resistance of each of the battery cells.

In the selecting, among the ordered battery cells, of the battery cells of the essential high-risk group having the highest probability that the terminal voltage during charging exceeds the upper limit value, for each state information, a battery cell having the highest terminal voltage, a battery cell having the lowest SoH, and a battery cell having the highest internal resistance among the ordered battery cells may be selected as the battery cells of the essential high-risk group.

In the selecting of the battery cells of the additional high-risk group having the probability that the terminal voltage during charging exceeds the upper limit value for each state information by using the battery cells of the essential high-risk group, battery cells corresponding to an intersection of at least two or more groups of a first group in which battery cells having a higher SoH and a smaller internal resistance than the battery cell having the highest terminal voltage are erased and remaining battery cells are selected, a second group in which battery cells having a lower terminal voltage and a smaller internal resistance than the battery cell having the lowest SoH are erased and remaining battery cells are selected, and a third group in which battery cells having a lower terminal voltage and a higher SoH than the battery cell having the highest internal resistance are erased and remaining battery cells are selected may be selected as the battery cells of the additional high-risk group.

The selecting of the battery cells of the high-risk group may include: ordering each battery cell for each state information according to an order in which the terminal voltage during discharging is likely to be less than a lower limit value of the operating voltage, selecting, among the ordered battery cells, battery cells of an essential high-risk group having the highest probability that the terminal voltage during discharging is less than the lower limit value, for each state information, selecting battery cells of an additional high-risk group having a probability that the terminal voltage during discharging is less than the lower limit value for each state information by using the battery cells of the essential high-risk group, and selecting battery cells corresponding to a union of the battery cells of the essential high-risk group and the battery cells of the additional high-risk group as battery cells of a final high-risk group.

In the ordering of each battery cell for each state information according to the order in which the terminal voltage during discharging is likely to be less than the lower limit value of the operating voltage, the terminal voltage according to the SoC of each of the battery cells may be calculated to order the battery cells in an order of the lower terminal voltage, order the battery cells in an order of the lower SoH of each of the battery cells, and order the battery cells in an order of the higher internal resistance of each of the battery cells.

In the selecting, among the ordered battery cells, of the battery cells of the essential high-risk group having the highest probability that the terminal voltage during discharging is less than the lower limit value, for each state information, a battery cell having the lowest terminal voltage, a battery cell having the lowest SoH, and a battery cell having the highest internal resistance among the ordered battery cells may be selected as the battery cells of the essential high-risk group.

In the selecting of the battery cells of the additional high-risk group having the probability that the terminal voltage during discharging is less than the lower limit value for each state information by using the battery cells of the essential high-risk group, battery cells corresponding to an intersection of at least two or more groups of a first group in which battery cells having a higher SoH and a smaller internal resistance than the battery cell having the lowest terminal voltage are erased and remaining battery cells are selected, a second group in which battery cells having a higher terminal voltage and a smaller internal resistance than the battery cell having the lowest SoH are erased and remaining battery cells are selected, and a third group in which battery cells having a higher terminal voltage and a higher SoH than the battery cell having the highest internal resistance are erased and remaining battery cells may be selected are selected as the battery cells of the additional high-risk group.

DESCRIPTION OF THE INVENTION

Hereinafter, the present invention will be described in detail with reference to the accompanying drawings. A detailed description for the well-known functions and configurations that may unnecessarily make the gist of the present invention unclear will be omitted.

In addition, a term "unit", "module", or the like described in the specification means a unit that processes at least one function or operation and may be implemented by hardware or software or a combination of hardware and software.

Figure 2:
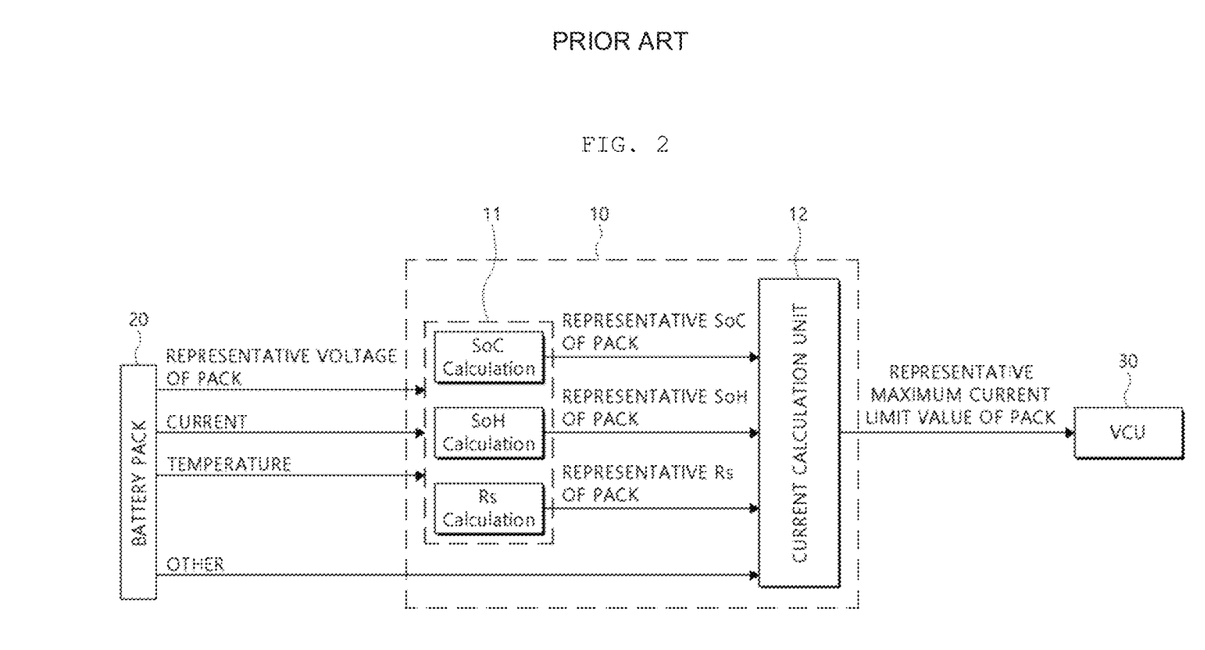
FIG. 2 is a diagram illustrating a conventional battery management system (BMS).

FIG. 2 is a diagram illustrating a conventional battery management system.

Referring to FIG. 2, a conventional battery management system 10 receives the representative pack voltage, current, and temperature from a battery pack 20, and a state information calculation unit 11 calculates a representative state of charge (SoC) of the battery pack, a representative state of health (SoH) of the battery pack 20, and a representative internal resistance Rs of the battery pack 20. A maximum current limit value for allowing the battery pack 20 to be charged and discharged within an operating voltage range may be calculated by the current calculation unit 12 using the representative SoC, the representative SoH, and the representative internal resistance Rs calculated in this way, and a load may be adjusted so that the maximum current limit value is transmitted to a vehicle control unit (VCU) 30 and a current within the maximum current limit value flows through the battery pack 20.

At this time, the load may be an inverter for controlling a motor, a charging device for charging the battery pack 20, or the like.

However, as described above, in the case of the actual battery pack that is unlike the ideal battery pack, since the internal resistance Rs, current capacity, and the like of each battery cell included in the battery pack are different from each other, the rate of decrease of the terminal voltage over time is different from each other, and the deviation in the value of the terminal voltage becomes severe as time passes.

Therefore, for the stability and efficiency of the battery pack, it is necessary to select and specially manage battery cells of a high-risk group, among the battery cells, which has a possibility of deteriorating by first reaching an upper limit value or a lower limit value of an operating voltage.

Figure 3:
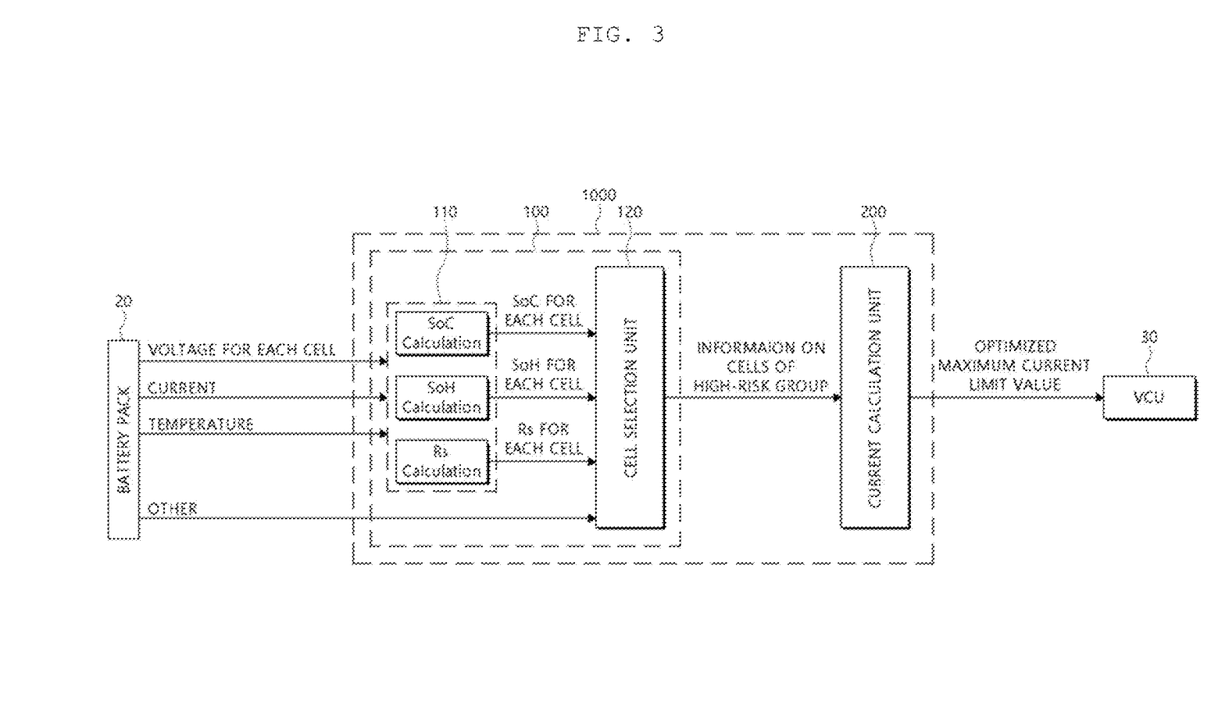
FIG. 3 is a diagram schematically illustrating a cell screening device according to the present invention.

FIG. 3 is a diagram schematically illustrating a cell screening device according to the present invention.

Referring to FIG. 3, a cell screening device 100 according to the present invention is a device included in a battery management system 1000 and includes a state information calculation unit 110 and a cell selection unit 120.

As illustrated, the battery management system 1000 receives the temperature of the battery pack or each of the battery cells, the voltage of each of the battery cells, and the current of the battery pack from the battery pack 20, and the current calculation unit 200 calculates the maximum current value and transmits calculated maximum current value to a VCU 30.

Here, the role of the cell screening device 100 of the present invention is to calculate state information for each battery cell using the voltage, current, and temperature for each cell received from the battery pack 20, and select battery cells of a high-risk group through the calculated state information.

According to the present invention, the maximum current value is not calculated by calculating the state information representing the battery pack as in the conventional battery management system 10, but the state information is calculated for each of the plurality of battery cells and the battery cells of the high-risk battery group are selected by using the calculated state information, and therefore, an optimized maximum current limit value that prevents an occurrence of a battery out of the operating voltage range during charging and discharging may be calculated based on such battery cells of the high-risk group.

At this time, the operating voltage range is a voltage range in which the battery cells may be stably charged and discharged without deterioration, and an upper limit value of the operating voltage range may be 4.2 V and a lower limit value thereof may be 2.7 V, which may be predetermined values.

In the following, each component of the cell screening device 100 of the present invention will be described in more detail.

The state information calculation unit 110 is a component that calculates state information of each of a plurality of battery cells included in the battery pack 20.

Here, the state information calculation unit 110 may receive at least one of the temperature of the battery pack or each of the battery cells, the voltage of each of the battery cells, and the current of the battery pack from the battery pack 20, and may calculate at least one of a state of charge (SoC), a state of health (SoH), and an internal resistance Rs of each of the battery cells as state information. The state information of each of the battery cells thus calculated is transmitted to a cell selection unit 120 to select the battery cells of the high-risk group.

At this time, since a method of calculating the SoC, the SoH, and the internal resistance Rs using the voltage, the current, the temperature, etc. is a known technique, a detailed description thereof will be omitted in the present invention.

In this way, since the state information calculation unit 110 calculates the state information for each battery cell, it is possible to know an actual usable capacity of the entire battery pack even when there is a deviation in the state for each battery cell.

The cell selection unit 120 is a component that orders the state information of each of the battery cells received from the state information calculation unit 110 and selects the battery cells of the high-risk group.

More specifically, in order to describe the cell selection unit 120, a case where the battery pack is charged and a case where the battery pack is discharged will be described.

1. Case where the battery pack is charged

The cell selection unit 120 orders each battery cell for each state information according to an order in which the terminal voltage during charging is likely to exceed the upper limit value of the operating voltage.

For example, if the SoC is calculated for each battery cell as the state information from the state information calculation unit 110, the cell selection unit 120 calculates a terminal voltage according to the SoC and orders the battery cells in the order of the higher terminal voltage. At this time, the terminal voltage matching the SoC may be pre-stored in the cell selection unit 120.

Here, the reason that the cell selection unit 120 orders the battery cells in the order of the higher terminal voltage is that the battery cell with a higher terminal voltage has a higher risk that the terminal voltage of the battery cell will exceed the upper limit value of the operating voltage range when charged with the same current.

In addition, if the SoH is calculated for each battery cell as the state information from the state information calculation unit 110, the cell selection unit 120 orders the battery cells in the order of the lower SoH.

Here, the reason that the cell selection unit 120 orders the battery cells in the order of the lower SoH is that the battery cell with a lower SoH may be in a state in which deterioration due to driving has progressed, or an internal resistance Rs is high due to a tolerance at the time of manufacture or an initial defect, and has a higher risk that the terminal voltage of the battery cell will exceed the upper limit value of the operating voltage range when charged with the same current.

In addition, if the internal resistance Rs is calculated for each battery cell as the state information from the state information calculation unit 110, the cell selection unit 120 orders the battery cells in the order of the higher internal resistance Rs.

Here, the reason that the cell selection unit 120 orders the battery cells in the order of the higher internal resistance Rs is that the battery cell with a higher internal resistance Rs has a higher risk that the terminal voltage of the battery cell will exceed the upper limit value of the operating voltage range when charged with the same current.

As described above, the alignment of battery cells according to the above-described order refers to alignment in the order in which the terminal voltage during charging of each battery cell is likely to exceed the upper limit value of the operating voltage, and needs to be performed for each calculated state information.

Thereafter, the cell selection unit 120 selects, among the ordered battery cells, battery cells of an essential high-risk group having the highest probability that the terminal voltage during charging will exceed the upper limit value of the operating voltage, for each state information.

At this time, the battery cells of the essential high-risk group correspond to a battery cell having the highest terminal voltage, a battery cell having the lowest SoH, and a battery cell having the highest internal resistance Rs, among the ordered battery cells.

If the battery cells of the essential high-risk group are selected, the cell selection unit 120 may use the battery cells of the essential high-risk group to select battery cells of an additional high-risk group for each state information.

More specifically, when one battery cell of the essential high-risk group with the greatest risk of being charged by exceeding the upper limit value of the operating voltage in any one of the state information is used as a reference battery cell, battery cells having a lower risk of being charged by exceeding the upper limit value of the operating voltage than the one battery cell of the essential high-risk group may be erased and the remaining battery cells may be selected in other state information, and a union of the selected battery cells by using all battery cells of the essential high-risk group as the reference battery cell may be used as the battery cells of the additional high-risk group.

For example, the cell selection unit 120 may erase battery cells having a higher SoH and a smaller internal resistance Rs than a battery cell having the highest terminal voltage, and select the remaining battery cells as a first group, may erase battery cells having a lower terminal voltage and a smaller internal resistance Rs than a battery cell having the lowest SoH, and select the remaining battery cells as a second group, may erase battery cells having a lower terminal voltage and a higher SoH than the battery cell having the highest internal resistance Rs, and select the remaining battery cells as a third group, and may select battery cells corresponding to an intersection of at least two or more groups among the first to third groups as the battery cells of the additional high-risk group.

Finally, the cell selection unit 120 may select battery cells corresponding to the union of the selected battery cells of the essential high-risk group and the battery cells of the additional high-risk group as battery cells of a final high-risk group at the time of charging.

2. Case where battery pack is discharged

The cell selection unit 120 orders each battery cell for each state information according to an order in which the terminal voltage during discharging is likely to be less than the lower limit value of the operating voltage.

For example, if the SoC is calculated for each battery cell as the state information from the state information calculation unit 110, the cell selection unit 120 calculates a terminal voltage according to the SoC and orders the battery cells in the order of the lower terminal voltage. At this time, the terminal voltage matching the SoC may be pre-stored in the cell selection unit 120.

Here, the reason that the cell selection unit 120 orders the battery cells in the order of the lower terminal voltage is that the battery cell with a lower terminal voltage has a higher risk that the terminal voltage of the battery cell will be discharged to be less than the lower limit value of the operating voltage range when discharged with the same current.

In addition, if the SoH is calculated for each battery cell as the state information from the state information calculation unit 110, the cell selection unit 120 orders the battery cells in the order of the lower SoH.

Here, the reason that the cell selection unit 120 orders the battery cells in the order of the lower SoH is that the battery cell with a lower SoH may be in a state in which deterioration due to driving has progressed, or an internal resistance Rs is high due to a tolerance at the time of manufacture or a defect, and has a higher risk that the terminal voltage of the battery cell will be discharged to be less than the lower limit value of the operating voltage range when discharged with the same current.

In addition, if the internal resistance is calculated for each battery cell as the state information from the state information calculation unit 110, the cell selection unit 120 orders the battery cells in the order of the higher internal resistance.

Here, the reason that the cell selection unit 120 orders the battery cells in the order of the higher internal resistance Rs is that the battery cell with a higher internal resistance Rs has a higher risk that the terminal voltage of the battery cell will be discharged to be less than the lower limit value of the operating voltage range when discharged with the same current.

As described above, the alignment of battery cells according to the above-described order refers to alignment in the order in which the terminal voltage during discharging of each battery cell is likely to be discharged to be less than the lower limit value of the operating voltage of the battery pack, and needs to be performed for each calculated state information.

Thereafter, the cell selection unit 120 selects, among the ordered battery cells, battery cells of an essential high-risk group having the highest probability that the terminal voltage during discharging will be less than the lower limit value, for each state information.

At this time, the battery cells of the essential high-risk group correspond to a battery cell having the highest terminal voltage, a battery cell having the lowest SoH, and a battery cell having the highest internal resistance Rs, among the ordered battery cells.

If the battery cells of the essential high-risk group are selected, the cell selection unit 120 may use the battery cells of the essential high-risk group to select battery cells of an additional high-risk group for each state information.

More specifically, when one battery cell of the essential high-risk group with the greatest risk of being discharged to be less than the lower limit value of the operating voltage in any one of the state information is used as a reference battery cell, the cell selection unit 120 may erase battery cells having a lower risk of being discharged to be less than the lower limit value of the operating voltage than the one battery cell of the essential high-risk group and select the remaining battery cells in other state information, and may use a union of the selected battery cells by using all battery cells of the essential high-risk group as the reference battery cell as the battery cells of the additional high-risk group.

For example, the cell selection unit 120 may erase battery cells having a higher SoH and a smaller internal resistance Rs than a battery cell having the lower terminal voltage, and select the remaining battery cells as a first group, may erase battery cells having a higher terminal voltage and a smaller internal resistance Rs than a battery cell having the lowest SoH, and select the remaining battery cells as a second group, may erase battery cells having a higher terminal voltage and a higher SoH than the battery cell having the highest internal resistance Rs, and select the remaining battery cells as a third group, and may select battery cells corresponding to an intersection of at least two or more groups among the first to third groups as the battery cells of the additional high-risk group.

Finally, the cell selection unit 120 may select battery cells corresponding to the union of the selected battery cells of the essential high-risk group and the battery cells of the additional high-risk group as battery cells of a final high-risk group at the time of discharging.

Information on the battery cells of the final high-risk group selected as described above is information for calculating a current value allowed in the battery pack, that is, a maximum current value, in order to prevent generation of battery cells that are charged to exceed the upper limit value of the operating voltage during charging or discharged to be less than the lower limit value of the operating voltage during discharging, and may be transmitted to the current calculation unit 200.

Meanwhile, the cell screen device according to the present invention determines the battery cells of the final high-risk group by further selecting not only the battery cells of the essential high-risk group with the greatest risk of out of the operating voltage range, but also the battery cells that may be out of the operating voltage range as the battery cells of the additional high-risk group, and thereafter, the current calculation unit 200 may more accurately calculate the maximum current value. That is, the cell screening device according to the present invention may contribute to increase the stability of the battery pack by providing information to calculate the optimized maximum current value.

In addition, since the battery cells of the final high-risk group selected in this way are battery cells that have a possibility of rapid deterioration among a plurality of battery cells constituting the battery pack, the battery cells of the final high-risk group among all battery cells included in the battery pack may be continuously managed as targets to be determined whether to be replaced first. That is, the battery pack may be efficiently maintained and managed.

Figure 4:
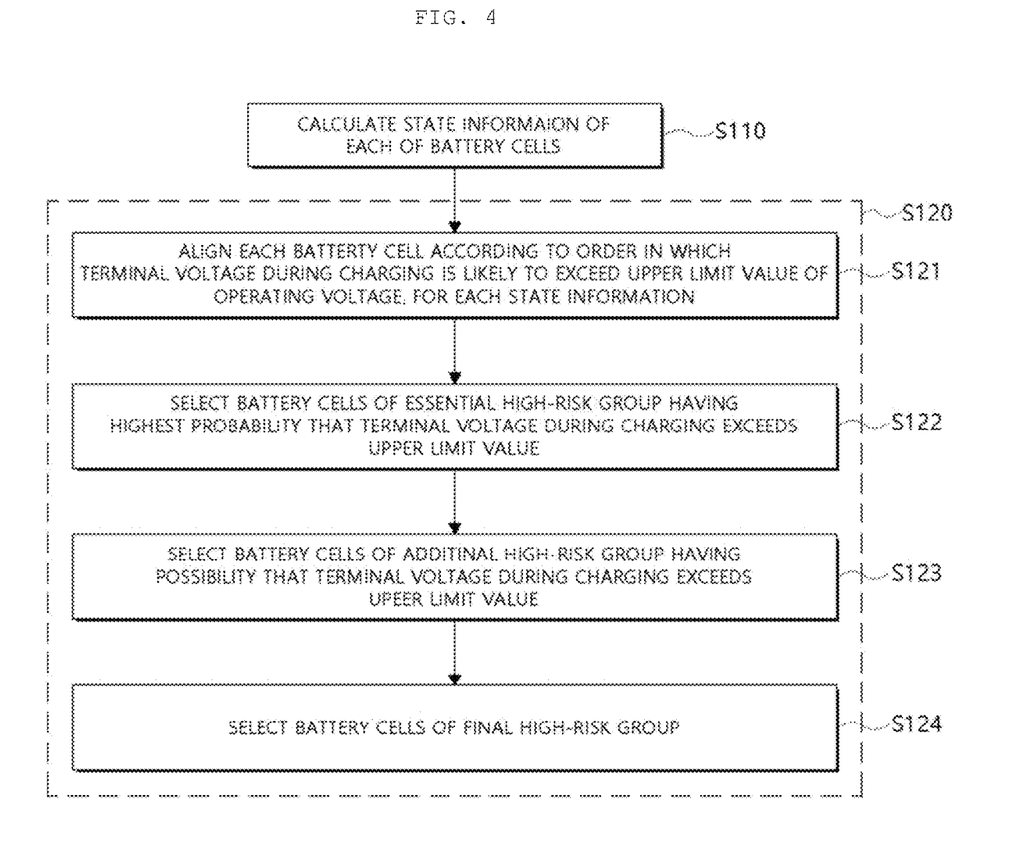
FIG. 4 is a flowchart illustrating a first embodiment in which a battery pack is charged in a cell screening method according to the present invention.

Meanwhile, FIG. 4 is a flowchart illustrating a first embodiment in which a battery pack 20 is charged in a cell screening method according to the present invention, and the cell screening method according to the first embodiment of the present invention may be performed by the cell screening device 100 described above.

Hereinafter, in order to increase the understanding of the cell screening method according to the first embodiment of the present invention, it will be described with further reference to FIG. 6.

Figure 6:
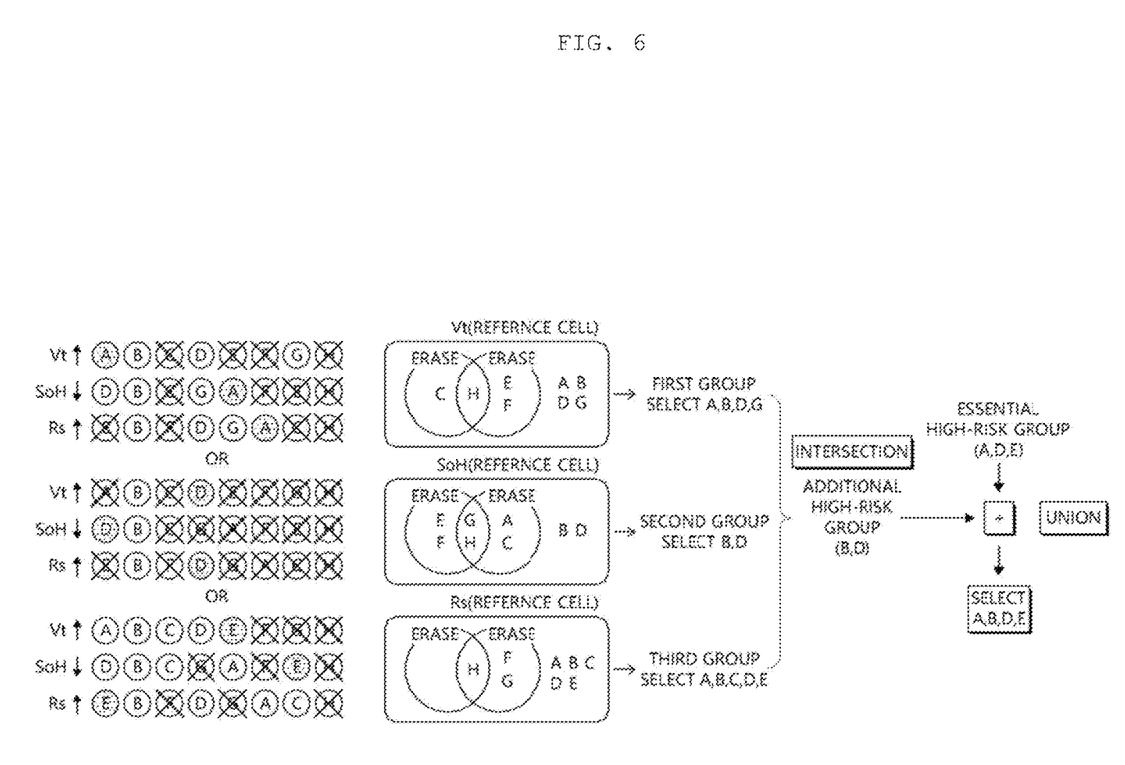
FIG. 6 is a diagram for explaining a specific example of the cell screening method according to the present invention.

FIG. 6 is a diagram for explaining a specific example of the cell screening method according to the first embodiment of the present invention.

Referring to FIGS. 4 and 6, in the cell screening method according to the first embodiment of the present invention, first, state information of each of the plurality of battery cells constituting the battery pack 20 is calculated (S110).

At this time, this step (S110) is performed by the state information calculation unit 110, and the state information calculation unit 110 may receive at least one of the temperature of the battery pack or each of the battery cells, the voltage of each of the battery cells, and the current of the battery pack from the battery pack 20, and may calculate at least one of a SoC, a SoH, and an internal resistance of each of the battery cells as state information.

Next, battery cells of a high-risk group are selected using the calculated state information (S120).

Here, the step (S120) of selecting the battery cells of the high-risk group is performed by the cell selection unit 120 and may be specifically performed through the following steps.

Each battery cell is ordered according to state information in an order in which the terminal voltage during charging is likely to exceed the upper limit value of the operating voltage (S121).

At this time, the cell selection unit 120 calculates a terminal voltage according to the SoC of each of the battery cells, and orders the battery cells in the order of the higher terminal voltage, orders the battery cells in the order of the lower SoH of each of the battery cells, and orders the battery cells in the order of the higher internal resistance Rs of each of the battery cells.

For example, as illustrated in FIG. 6, among the battery cells, a battery cell having the highest terminal voltage is a cell A, and a battery cell having the lowest terminal voltage is a cell H, and the cell selection unit 120 may order from cell A to cell H in the order of the higher terminal voltage.

In addition, among the battery cells, a battery cell having the lowest SoH is a cell D, and a battery cell having the highest SoH is a cell H, and the cell selection unit 120 may order from the cell D to cell H in the order of the lower SoH.

In addition, among the battery cells, a battery cell having the highest internal resistance Rs is a cell E, and a battery cell having the lowest internal resistance a cell H, and the cell selection unit 120 may order from the cell E to cell H in the order of the higher internal resistance.

Next, among the ordered battery cells, battery cells of an essential high-risk group having the highest probability that the terminal voltage during charging will exceed the upper limit value of the operating voltage are selected for each state information (S122).

At this time, among the ordered battery cells, a battery cell having the highest terminal voltage, a battery cell having the lowest SoH, and a battery cell having the highest internal resistance Rs are selected as the battery cells of the essential high-risk group.

For example, as illustrated in FIG. 6, among the battery cells, since the battery cell having the highest terminal voltage is the cell A, the battery cell having the lowest SoH is the cell D, and the battery cell having the highest internal resistance Rs is the cell E, the cell A, the cell D, and the cell E may be selected as the battery cells of the essential high-risk group.

Next, battery cells of an additional high-risk group that have a possibility that the terminal voltage during charging exceeds the upper limit value of the operating voltage are selected for each state information using the battery cells of the essential high-risk group (S123).

At this time, the cell selection unit 120 may erase battery cells having a higher SoH and a smaller internal resistance Rs than a battery cell having the highest terminal voltage, and select the remaining battery cells as a first group, may erase battery cells having a lower terminal voltage and a smaller internal resistance Rs than a battery cell having the lowest SoH, and select the remaining battery cells as a second group, may erase battery cells having a lower terminal voltage and a higher SoH than the battery cell having the highest internal resistance Rs, and select the remaining battery cells as a third group, and may select battery cells corresponding to an intersection of at least two or more groups among the first to third groups as the battery cells of the additional high-risk group.

For example, as illustrated in FIG. 6, in order to select battery cells having a lower SoH and larger internal resistance Rs than the cell A, which is the battery cell having the highest terminal voltage, the cell F, the cell E, and the cell H, which are the battery cells having a higher SoH than the cell A based on cell A, are erased, and the cell C and the cell H, which are the battery cells having a smaller internal resistance Rs than the cell A based on the cell A, are erased. The remaining battery cells are the cell A, the cell B, the cell D, and the cell G, which are selected as a first group.

In addition, in order to select battery cells having a higher terminal voltage and larger internal resistance Rs than the cell D, which is the battery cell having the lowest SoH, the cell E, the cell F, the cell G, and the cell H, which are the battery cells having a lower terminal voltage than the cell D based on cell D, are erased, and the cell G, the cell A, the cell C, and the cell H, which are the battery cells having a smaller internal resistance Rs than the cell D based on the cell D, are erased. The remaining battery cells are the cell B and the cell D, which are selected as a second group.

In addition, in order to select battery cells having a higher terminal voltage and a lower SoH than the cell E, which is the battery cell having the highest internal resistance Rs, the cell F, the cell G, and the cell H, which are the battery cells having a lower terminal voltage than the cell E based on cell E, are erased, and the cell H, which is the battery cell having a lower SoH than the cell E based on the cell E, is erased. The remaining battery cells are the cell A, the cell B, the cell C, the cell D, and the cell E, which are selected as a third group.

If the battery cells of the first to third groups are selected, a union of two or more of the selected battery cells is selected as battery cells of an additional high-risk group. For example, as illustrated in FIG. 6, the cell B and the cell D, which are the union of all of the first to third groups, may be selected as the battery cells of the additional high-risk group.

Finally, battery cells corresponding to the union of the battery cells of the essential high-risk group and the battery cells of the additional high-risk group are selected as battery cells of a final high-risk group (S124).

For example, as illustrated in FIG. 6, the cell A, the cell B, the cell D, and the cell E may be selected as the battery cells of the final high-risk group.

Figure 5:
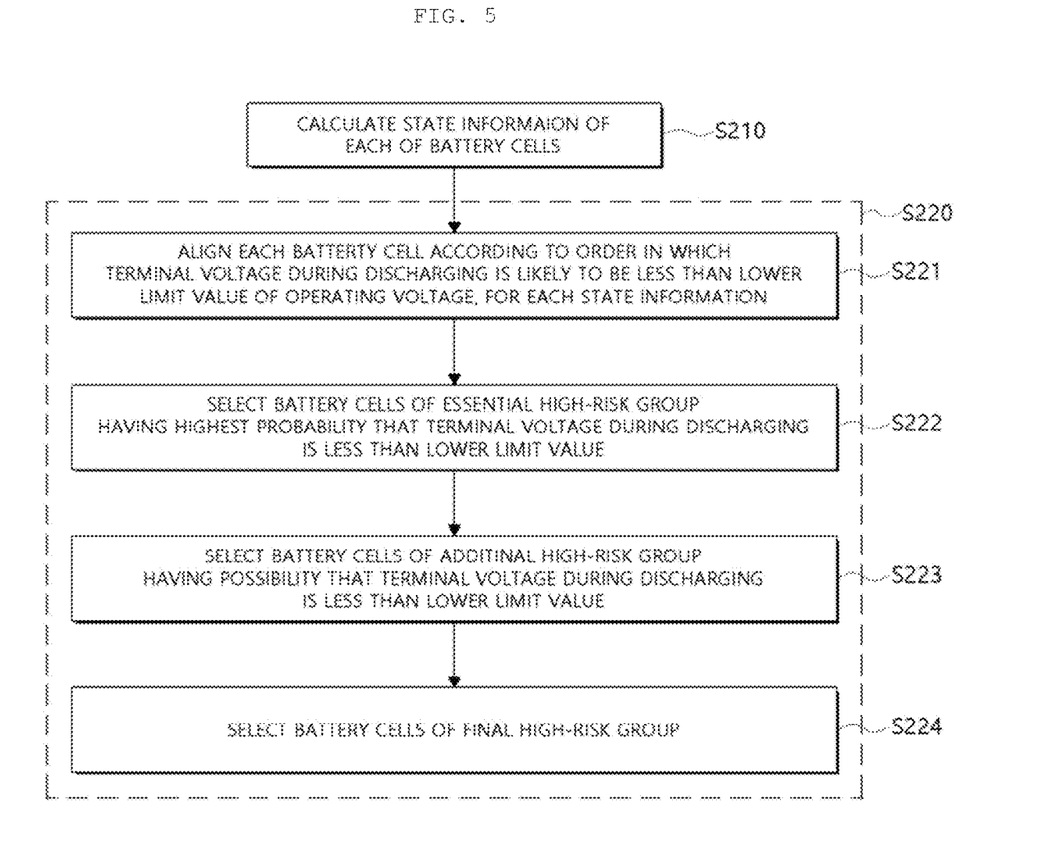
FIG. 5 is a flowchart illustrating a second embodiment in which the battery pack is discharged in the cell screening method according to the present invention.

FIG. 5 is a flowchart illustrating a second embodiment in which a battery pack 20 is discharged in a cell screening method according to the present invention, and the cell screening method according to the second embodiment of the present invention may also be performed by the cell screening device 100 described above.

In the cell screening method according to the second embodiment of the present invention, first, state information of each of the plurality of battery cells constituting the battery pack 20 is calculated (S210).

At this time, this step (S210) is performed by the state information calculation unit 110, and the state information calculation unit 110 may receive at least one of the temperature of the battery pack or each of the battery cells, the voltage of each of the battery cells, and the current of the battery pack from the battery pack 20, and may calculate at least one of a SoC, a SoH, and an internal resistance Rs of each of the battery cells as state information.

Next, battery cells of a high-risk group are selected using the calculated state information (S220).

Here, the step (S220) of selecting the battery cells of the high-risk group is performed by the cell selection unit 120 and may be specifically performed through the following steps.

Each battery cell is ordered according to state information in an order in which the terminal voltage during discharging is likely to be less than the lower limit value of the operating voltage (S221).

At this time, the cell selection unit 120 calculates a terminal voltage according to the SoC of each of the battery cells, and orders the battery cells in the order of the lower terminal voltage, orders the battery cells in the order of the lower SoH of each of the battery cells, and orders the battery cells in the order of the higher internal resistance of each of the battery cells.

Next, among the ordered battery cells, battery cells of an essential high-risk group having the highest probability that the terminal voltage during discharging will be less than the lower limit value of the operating voltage are selected for each state information (S222).

At this time, among the ordered battery cells, a battery cell having the lowest terminal voltage, a battery cell having the lowest SoH, and a battery cell having the highest internal resistance Rs are selected as the battery cells of the essential high-risk group.

Next, battery cells of an additional high-risk group that have a possibility that the terminal voltage during discharging will be less than the lower limit value of the operating voltage are selected for each state information using the battery cells of the essential high-risk group (S223).

At this time, the cell selection unit 120 may erase battery cells having a higher SoH and a smaller internal resistance Rs than a battery cell having the lower terminal voltage, and select the remaining battery cells as a first group, may erase battery cells having a higher terminal voltage and a smaller internal resistance Rs than a battery cell having the lowest SoH, and select the remaining battery cells as a second group, may erase battery cells having a higher terminal voltage and a higher SoH than the battery cell having the highest internal resistance Rs, and select the remaining battery cells as a third group, and may select battery cells corresponding to an intersection of at least two or more groups among the first to third groups as the battery cells of the additional high-risk group.

Finally, battery cells corresponding to the union of the battery cells of the essential high-risk group and the battery cells of the additional high-risk group are selected as battery cells of a final high-risk group (S224).

As described above, in the cell screen method according to the first and second embodiments of the present invention, the battery cells of the final high-risk group are determined by further selecting not only the battery cells of the essential high-risk group with the greatest risk of out of the operating voltage range, but also the battery cells that may be out of the operating voltage range as the battery cells of the additional high-risk group, and thereafter, the current calculation unit 200 may more accurately calculate the maximum current value. That is, the cell screening device according to the present invention may contribute to increase the stability of the battery pack by providing information to calculate the optimized maximum current value.

In addition, since the battery cells of the final high-risk group selected in this way are battery cells that have a possibility of rapid deterioration among a plurality of battery cells constituting the battery pack, the battery cells of the final high-risk group among all battery cells included in the battery pack may be continuously managed as targets to be determined whether to be replaced first. That is, since the entire battery pack does not need to be replaced, the battery pack may be efficiently maintained and managed.

In addition, a more detailed description of the cell screening method according to the first and second embodiments of the present invention may be replaced with the above description of the cell screening device 100 according to the present invention.

According to the present invention, the state information calculation unit receives the voltage of each of the plurality of battery cells, and calculates the state information for each battery cell by using the received voltage, so that even when there is a deviation for each battery cell, the actual usable capacity of the entire battery pack may be known.

Further, according to the present invention, the battery cells may be ordered in the order of high probability of being out of the upper limit value or the lower limit value of the operating voltage among the plurality of battery cells using the state information calculated for each battery cell, thereby making it possible to select battery cells of the high-risk group.

As described above, although the present invention has been described by the limited embodiments and drawings, the present invention is not limited to the above embodiments, and various modifications and variations are possible from these descriptions by those of ordinary skill in the field to which the present invention pertains. Therefore, the spirit of the present invention should be understood only by the claims, and all of the equivalences and equivalent modifications to the claims are intended to fall within the scope and spirit of the present invention.

DETAILED DESCRIPTION OF MAIN ELEMENTS 1, 1000: Battery management system
10, 110: State information calculation unit
20, 200: Current calculation unit
100: Cell screening device
120: Cell selection unit

What is claimed is:
1. A battery cell screening device comprising:
a state information calculation unit configured to calculate state information of each of a plurality of battery cells; and
a cell selection unit configured to select at least one battery cell of a high-risk group using the state information,
wherein the at least one battery cell of the high-risk group includes a battery cell having a terminal voltage that is out of an operating voltage during a charge or a discharge,
wherein the state information calculation unit receives at least one of a temperature of a battery pack or each of the battery cells, a voltage of each of the battery cells, and a current of the battery pack from the battery pack including the plurality of battery cells, and calculates at least two of a state of charge (SoC), a state of health (SoH), and an internal resistance of each of the battery cells as the state information,
during charging, wherein the cell selection unit orders each battery cell for each state information according to an order in which the terminal voltage is likely to exceed an upper limit value of the operating voltage,
wherein the cell selection unit selects, among the ordered battery cells, battery cells of an essential high-risk group having the highest probability that the terminal voltage exceeds an upper limit value of the operating voltage, for each state information,
wherein when one battery cell of the essential high-risk group with the greatest risk of being charged by exceeding the upper limit value of the operating voltage in any one of the state information is used as a reference battery cell, for each state information, the cell selection unit erases battery cells having a lower risk of being charged by exceeding the upper limit value of the operating voltage than the reference battery cell and selects the remaining battery cells as the battery cells of an additional high-risk group, in other state information, wherein the cell selection unit selects battery cells corresponding to a union of the battery cells of the essential high-risk group and the battery cells of the additional high-risk group as battery cells of a final high-risk group,
during discharging, wherein the cell selection unit orders each battery cell for each state information according to an order in which the terminal voltage is likely to be less than a lower limit value of the operating voltage,
wherein the cell selection unit selects, among the ordered battery cells, battery cells of an essential high-risk group having the highest probability that the terminal voltage is less than a lower limit value of the operating voltage, for each state information,
wherein when one battery cell of the essential high-risk group with the greatest risk of being discharged to be less than the lower limit value of the operating voltage in any one of the state information is used as a reference battery cell, for each state information, the cell selection unit erases battery cells having a lower risk of being discharged to be less than the lower limit value of the operating voltage than the reference battery cell and selects the remaining battery cells as the battery cells of the additional high-risk group, in other state information, and
wherein the cell selection unit selects battery cells corresponding to a union of the battery cells of the essential high-risk group and the battery cells of the additional high-risk group as battery cells of a final high-risk group.

2. A battery cell screening method comprising:
calculating state information of each of a plurality of battery cells; and
selecting at least one battery cell of a high-risk group using the state information,
wherein the at least one battery cell of the high-risk group includes a battery cell having a terminal voltage that is out of an operating voltage during a charge or a discharge,
wherein the state information calculation unit receives at least one of a temperature of a battery pack or each of the battery cells, a voltage of each of the battery cells, and a current of the battery pack from the battery pack including the plurality of battery cells, and calculates at least two of a state of charge (SoC), a state of health (SoH), and an internal resistance of each of the battery cells as the state information,
during charging, wherein the cell selection unit orders each battery cell for each state information according to an order in which the terminal voltage is likely to exceed an upper limit value of the operating voltage,
wherein the cell selection unit selects, among the ordered battery cells, battery cells of an essential high-risk group having the highest probability that the terminal voltage exceeds an upper limit value of the operating voltage, for each state information,
wherein when one battery cell of the essential high-risk group with the greatest risk of being charged by exceeding the upper limit value of the operating voltage in any one of the state information is used as a reference battery cell, for each state information, the cell selection unit erases battery cells having a lower risk of being charged by exceeding the upper limit value of the operating voltage than the reference battery cell and selects the remaining battery cells as the battery cells of an additional high-risk group, in other state information,
wherein the cell selection unit selects battery cells corresponding to a union of the battery cells of the essential high-risk group and the battery cells of the additional high-risk group as battery cells of a final high-risk group,
during discharging, wherein the cell selection unit orders each battery cell for each state information according to an order in which the terminal voltage is likely to be less than a lower limit value of the operating voltage,
wherein the cell selection unit selects, among the ordered battery cells, battery cells of an essential high-risk group having the highest probability that the terminal voltage is less than a lower limit value of the operating voltage, for each state information,
wherein when one battery cell of the essential high-risk group with the greatest risk of being discharged to be less than the lower limit value of the operating voltage in any one of the state information is used as a reference battery cell, for each state information, the cell selection unit erases battery cells having a lower risk of being discharged to be less than the lower limit value of the operating voltage than the reference battery cell and selects the remaining battery cells as the battery cells of the additional high-risk group, in other state information, and
wherein the cell selection unit selects battery cells corresponding to a union of the battery cells of the essential high-risk group and the battery cells of the additional high-risk group as battery cells of a final high-risk group.

3. The battery cell screening method of claim 2, wherein in the ordering of each battery cell for each state information according to the order in which the terminal voltage during charging is likely to exceed the upper limit value of the operating voltage, the terminal voltage according to the SoC of each of the battery cells is calculated to order the battery cells in an order of the higher terminal voltage, order the battery cells in an order of the lower SoH of each of the battery cells, and order the battery cells in an order of the higher internal resistance of each of the battery cells.

4. The battery cell screening method of claim 2, wherein in the selecting, among the ordered battery cells, of the battery cells of the essential high-risk group having the highest probability that the terminal voltage during charging exceeds the upper limit value, for each state information,
a battery cell having the highest terminal voltage, a battery cell having the lowest SoH, and a battery cell having the highest internal resistance among the ordered battery cells are selected as the battery cells of the essential high-risk group.

5. The battery cell screening method of claim 2, wherein in the selecting of the battery cells of the additional high-risk group, battery cells corresponding to an intersection of at least two or more groups of a first group in which battery cells having a higher SoH and a smaller internal resistance than the battery cell having the highest terminal voltage are erased and remaining battery cells are selected, a second group in which battery cells having a lower terminal voltage and a smaller internal resistance than the battery cell having the lowest SoH are erased and remaining battery cells are selected, and a third group in which battery cells having a lower terminal voltage and a higher SoH than the battery cell having the highest internal resistance are erased and remaining battery cells are selected as the battery cells of the additional high-risk group.

6. The battery cell screening method of claim 2, wherein in the ordering of each battery cell for each state information according to the order in which the terminal voltage during discharging is likely to be less than the lower limit value of the operating voltage, the terminal voltage according to the SoC of each of the battery cells is calculated to order the battery cells in an order of the lower terminal voltage, order the battery cells in an order of the lower SoH of each of the battery cells, and order the battery cells in an order of the higher internal resistance of each of the battery cells.

7. The battery cell screening method of claim 2, wherein in the selecting, among the ordered battery cells, of the battery cells of the essential high-risk group having the highest probability that the terminal voltage during discharging is less than the lower limit value, for each state information, a battery cell having the lowest terminal voltage, a battery cell having the lowest SoH, and a battery cell having the highest internal resistance among the ordered battery cells are selected as the battery cells of the essential high-risk group.

8. The battery cell screening method of claim 2, wherein in the selecting of the battery cells of the additional high-risk group having the probability that the terminal voltage during discharging is less than the lower limit value for each state information by using the battery cells of the essential high-risk group, battery cells corresponding to an intersection of at least two or more groups of a first group in which battery cells having a higher SoH and a smaller internal resistance than the battery cell having the lowest terminal voltage are erased and remaining battery cells are selected, a second group in which battery cells having a higher terminal voltage and a smaller internal resistance than the battery cell having the lowest SoH are erased and remaining battery cells are selected, and a third group in which battery cells having a higher terminal voltage and a higher SoH than the battery cell having the highest internal resistance are erased and remaining battery cells are selected as the battery cells of the additional high-risk group.

* * * * *